(12) United States Patent
Tashiro

(10) Patent No.: US 8,233,127 B2
(45) Date of Patent: Jul. 31, 2012

(54) LIQUID CRYSTAL DISPLAY DEVICE

(75) Inventor: Tomohiro Tashiro, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 898 days.

(21) Appl. No.: 12/325,515

(22) Filed: Dec. 1, 2008

(65) Prior Publication Data
US 2009/0153790 A1 Jun. 18, 2009

(30) Foreign Application Priority Data

Dec. 12, 2007 (JP) ................. 2007-320408

(51) Int. Cl.
*G02F 1/1345* (2006.01)

(52) U.S. Cl. ........ 349/149; 349/150; 349/151; 349/152; 349/153; 349/155; 174/250; 345/87; 345/98; 345/104; 257/684; 257/784; 257/690; 257/691; 257/692; 257/693; 257/694; 257/695

(58) Field of Classification Search .............. 349/58, 349/149, 150
See application file for complete search history.

(56) References Cited

U.S. PATENT DOCUMENTS

| 6,853,361 | B2 * | 2/2005 | Tsuyuki et al. | 345/92 |
| 2003/0231275 | A1 * | 12/2003 | Shirato et al. | 349/149 |
| 2005/0041166 | A1 * | 2/2005 | Yamazaki et al. | 349/42 |
| 2007/0176917 | A1 * | 8/2007 | Kawano | 345/209 |
| 2008/0049170 | A1 * | 2/2008 | Hwang et al. | 349/69 |
| 2008/0074603 | A1 * | 3/2008 | Imaoka | 349/152 |
| 2008/0197305 | A1 * | 8/2008 | Hakamata et al. | 250/580 |

FOREIGN PATENT DOCUMENTS

JP 2000-137445 5/2000

* cited by examiner

*Primary Examiner* — Edward Glick
*Assistant Examiner* — Sang Nguyen
(74) *Attorney, Agent, or Firm* — Oblon, Spivak, McClelland, Maier & Neustadt, L.L.P.

(57) ABSTRACT

An object of the present invention is to reduce a lateral width of an FPC also with evenly aligned and arranged plurality of ICs. The liquid crystal display device according to the present invention includes a glass substrate, a plurality of ICs of COG (Chip On Glass) configuration aligned on a glass substrate along a side thereof, and an FPC (Flexible Printed Circuit) that is arranged to extend along the side of the glass substrate and that is connected to the plurality of ICs. Specified ICs from among the plurality of ICs are arranged in that extending directions of their longer sides are inclined with respect to an extending direction of the side of the glass substrate such that the longer sides face towards a central side of the FPC.

10 Claims, 9 Drawing Sheets

F I G . 1
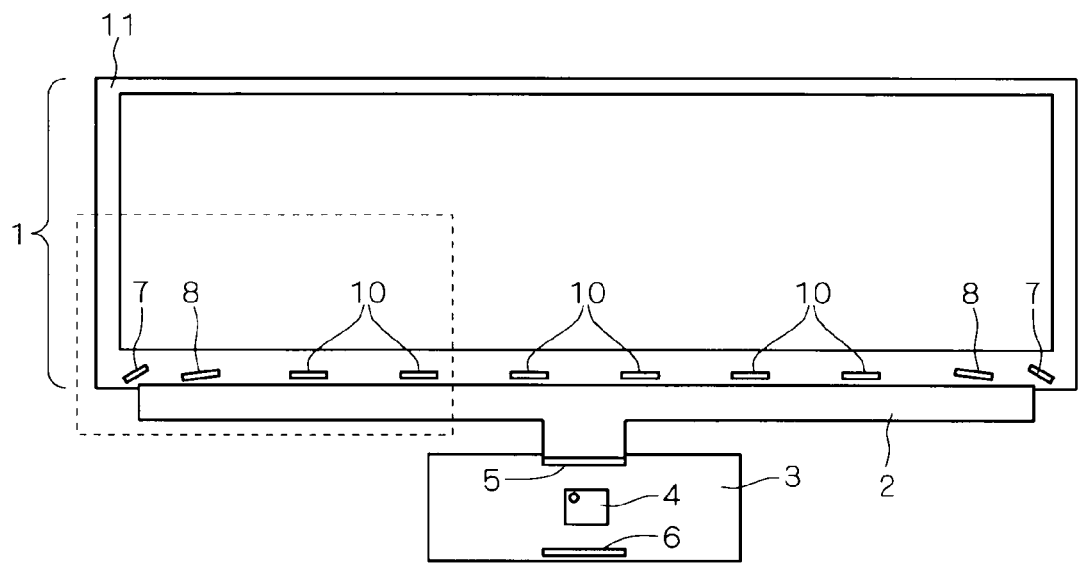
F I G . 2
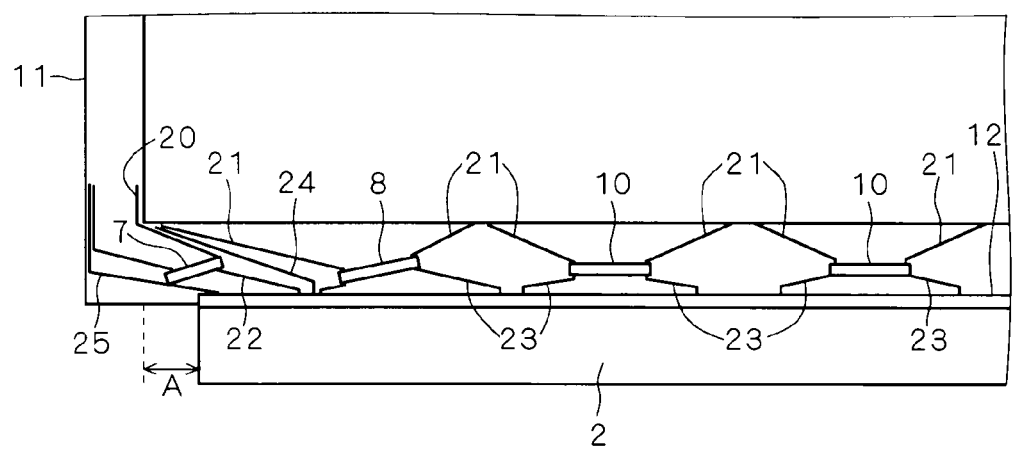

F I G . 1 3
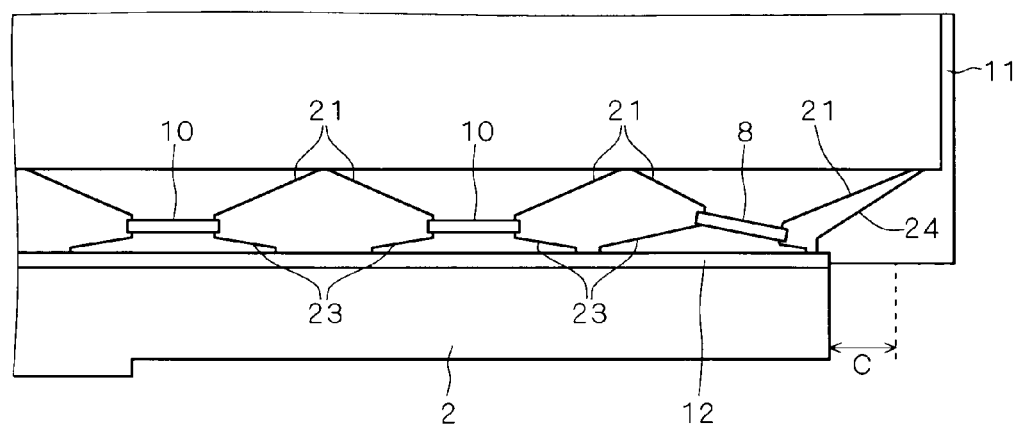
F I G . 1 4
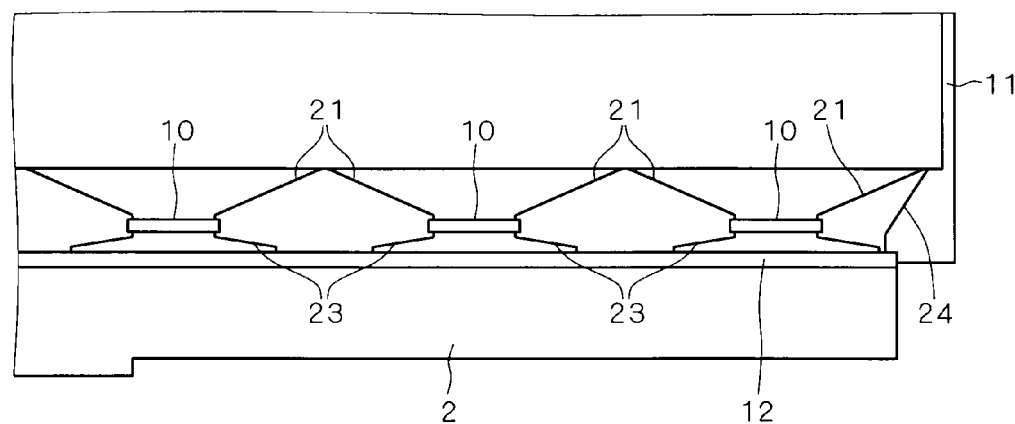

LIQUID CRYSTAL DISPLAY DEVICE

BACKGROUND OF THE INVENTION

1. Field of the Invention

The present invention relates to a liquid crystal display device, and particularly to a liquid crystal display device having ICs of COG (Chip On Glass) configuration mounted thereon.

2. Description of the Background Art

A liquid crystal display employs a COG (Chip On Glass) technique in these years. In a liquid display panel of the liquid crystal display, ICs of COG configuration aligned on a glass substrate, which is an insulating substrate, are connected to a control board via an FPC (Flexible Printed Circuit). Japanese Patent Application Laid-Open No. 2000-137445 discloses a flat display device employing such an FPC. In a case the glass substrate of the liquid crystal display is laterally long, a lateral width of the FPC will become accordingly long so that it is required to reduce a cumulative dimensional tolerance of panel connecting terminals of the FPC. In dealing with this matter, it has been suggested to loosely set pitches of the panel connecting terminals or to employ a hardly expandable layer arrangement and insulating material of FPC.

However, loosely setting the pitches of the panel connecting terminals will result in a longer lateral width of the FPC and thus in increased costs. On the other hand, reducing the number of layers constituting the FPC (for instance, when a normal CCL (Copper Clad Laminate) is changed to an adhesive less CCL (Copper Clad Laminate) which is stronger against expansion) results in higher costs. In case a plurality of FPCs are provided, it will be possible to reduce the number of panel connecting terminals for one FPC and reduce the length of the FPC so that it is possible to reduce the cumulative dimensional tolerance. However, this leads to a drawback that the plurality of FPCs need to be surface-adhered individually to a worksheet and that an increased number of FPCs at an identical total length will result in increased costs in view of control.

SUMMARY OF THE INVENTION

It is an object of the present invention to provide a liquid crystal display device wherein, in case of providing at least one or more FPCs, by reducing lengths of the respective FPCs for reducing an entire length of the FPC, costs for the FPCs and a cumulative dimensional tolerance can be reduced.

The present invention provides a liquid crystal display device including an insulating substrate, a plurality of ICs of COG (Chip On Glass) configuration, and an FPC (Flexible Printed Circuit). The plurality of ICs are arranged on the insulating substrate along the side of the insulating substrate. The FPC is arranged to extend along a side of the insulating substrate and is connected to the plurality of ICs. Specified ICs from among the plurality of FPCs are arranged in that extending directions of their long sides are inclined with respect to an extending direction of the side of the insulating substrate such that these long sides face towards a central side of insulating substrate such that these long sides face towards a central side of the FPC.

By aligning the plurality of ICs in an inclined manner, it is possible to shorten the length of the FPC, that is, a lateral width thereof. With this arrangement, it is possible to reduce costs of the FPC and to reduce the cumulative dimensional tolerance.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view showing one example of a liquid crystal display device according to a first embodiment.

FIG. 2 is an enlarged view of a broken line portion of FIG. 1.

FIG. 13 is an enlarged view of a broken line portion of FIG. 12.

FIG. 14 is a view showing an IC arrangement substantially similar to a conventional one only on a right end portion of the FPC in FIG. 12.

DESCRIPTION OF THE PREFERRED EMBODIMENTS

First Embodiment

Figure 15:
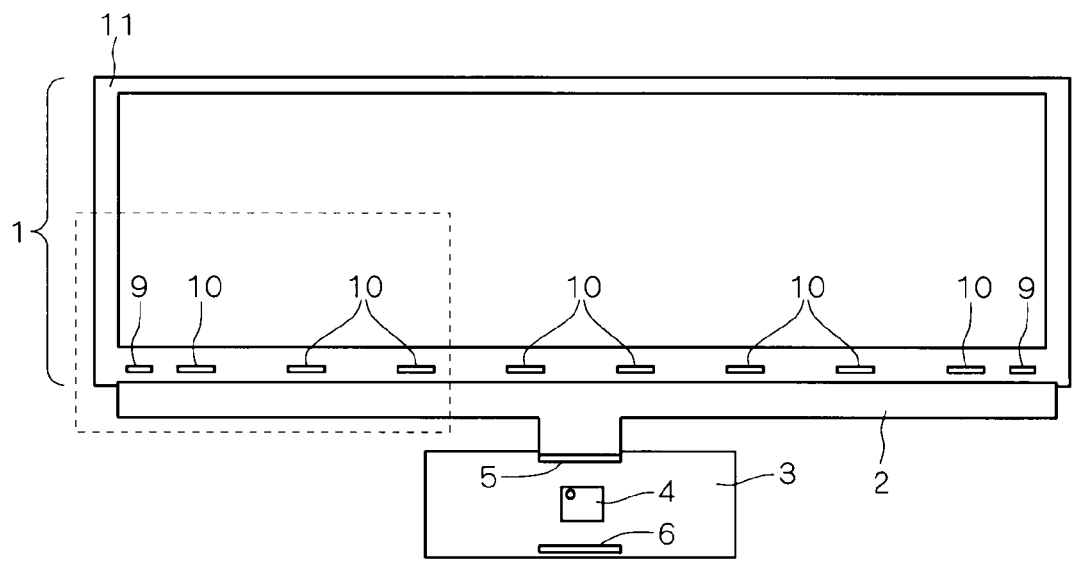
FIG. 15 is a view showing one example of a conventional IC arrangement plan and an FPC.

Prior to describing a liquid crystal display device of the present embodiment, a conventional liquid crystal display device will be described with reference to FIGS. 15 to 18. FIG. 15 is a front view of the conventional liquid crystal display device. As shown in FIG. 15, the conventional liquid crystal display device includes a glass substrate 11, which is an insulating substrate, a liquid crystal panel 1 including a plurality of ICs 9, 10 of COG (Chip On Glass) configuration, an FPC (Flexible Printed Circuit) 2 and a control board 3.

The plurality of ICs 9, 10 according to FIG. 15 include gate ICs 9 and source ICs 10. As shown in FIG. 15, the plurality of ICs 9, 10 are aligned on the glass substrate 11 at even intervals along a side of the glass substrate 11 which is an insulating substrate. The gate ICs 9 are arranged on both end portions of an alignment of the plurality of ICs 9, 10 while the source ICs 10 are arranged elsewhere. Respective shapes of the plurality of ICs 9, 10 according to FIG. 15 are rectangular, and the plurality of ICs 9, 10 are arranged such that extending directions of their long sides are parallel to an extending direction of the side of the glass substrate 11.

A T-CON (Timing Controller) 4, an FPC joint connector 5, and a system side joint connector 6 are provided on the control board 3. The FPC 2 is connected to the control board 3 via the FPC joint connector 5.

Figure 16:
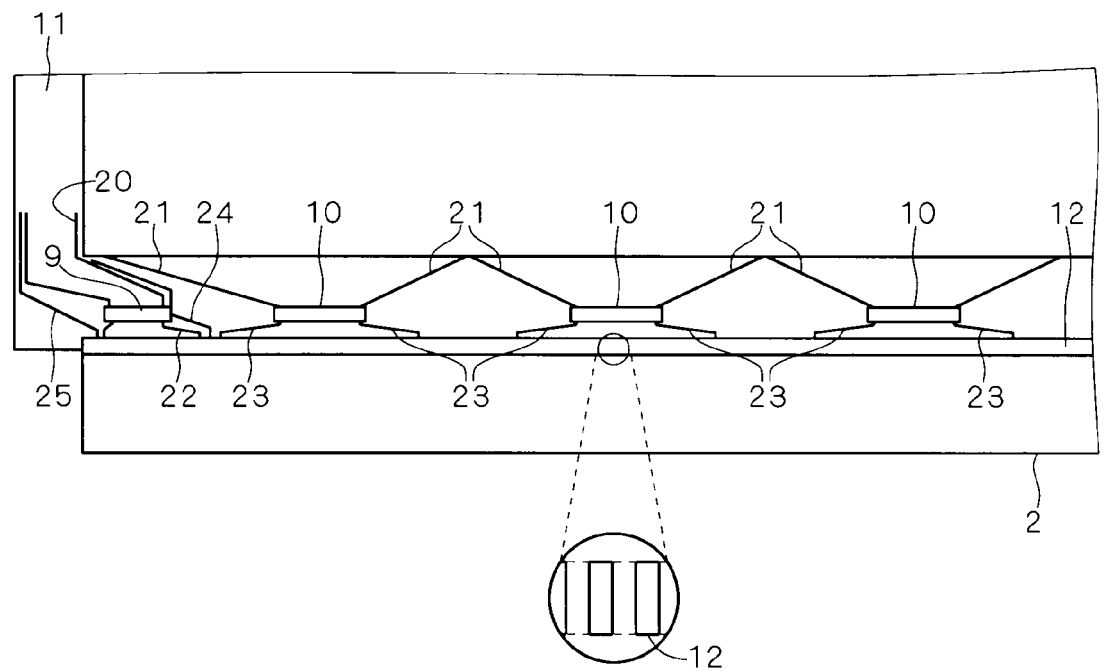
FIG. 16 is an enlarged view of a broken line portion of FIG. 15.

As shown in FIG. 15, the FPC 2 is arranged to extend along a side of the glass substrate 11. The shape of the FPC 2 according to the present embodiment is made to be of a T-shaped form. FIG. 16 is a view showing a broken line portion of FIG. 15, that is, a vicinity of the FPC 2 on a left-hand side shown in an enlarged form. As shown in FIG. 16, the FPC 2 is connected to the plurality of ICs 9, 10. The FPC 2 further includes a plurality of panel connecting terminals 12. A lower side of FIG. 16 shows the plurality of panel connecting terminals 12 in an enlarged form. Since the panel connecting terminals 12 become too small and complicated in a miniature, the following miniatures show the panel connecting terminals 12 in a simplified form as in FIG. 16.

The gate ICs 9 are connected to gates of respective pixels on the glass substrate 11 via gate IC output wirings 20 and are further connected to the panel connecting terminals 12 of the FPC 2 via gate IC input wirings 22. substrate 11 via source IC output wirings 21 and are further connected to the panel connecting terminals 12 of the FPC 2 via source IC input wirings 23. VCOM wirings 24, 25 connect opposite electrodes on the glass substrate 11 with the FPC 2.

It should be noted that while the plurality of ICs 9, 10 are connected to a plurality of wirings, respectively, only the wirings on both ends of the plurality of ICs 9, 10 are illustrated in FIG. 16 for ease of understanding. Further, from among the panel connecting terminals 12, panel connecting terminals that are not connected to the gate IC input wirings 22, the source IC input wirings 23, and the VCOM wirings 24, 25 will be hereinafter referred to as "dummy wirings".

Generally, pitches of panel connecting terminals 12 of the FPC 2 are larger than pitches of input terminals of the gate ICs 9 and the source ICs 10. For instance, in case of a liquid crystal panel of 5 inches class and more, pitches of the input terminals of the ICs are approximately several tens of μm while pitches of the panel connecting terminals 12 of the FPC 2 are approximately several hundreds of μm. Accordingly, wiring regions of the gate IC input wirings 22 and the source IC input wirings 23 will assume an outwardly widening shape when seen from the gate ICs 9 and the source ICs 10 towards the FPC 2 as shown in FIG. 16.

Figure 17:
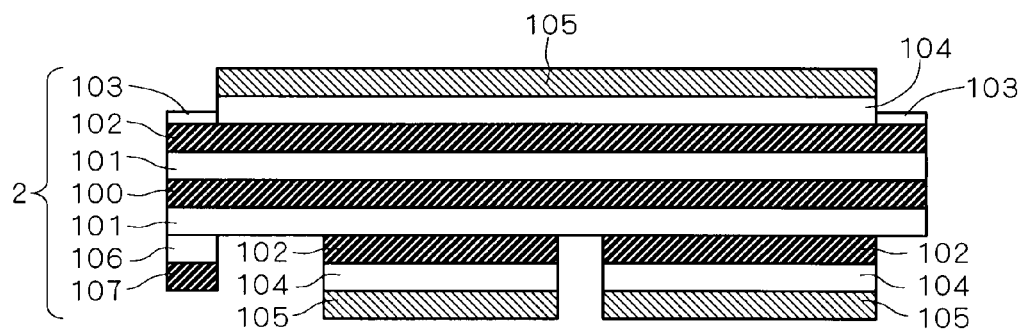
FIG. 17 is a general sectional view of the FPC.

FIG. 17 is a sectional view of the FPC 2 made of a normal CCL. The FPC 2 according to FIG. 17 includes a base film 100, a base film adhesive 101, a copper foil with copper plating 102, a gold plating 103, a coverlay adhesive 104, a coverlay 105, a reinforcing plate adhesive 106, and a reinforcing plate 107. Here, a normal CCL refers to a structure of three layers, that is, in which a layer of the base film 100 and a layer of the copper foil 102 are glued together by a layer of the base film adhesive 101. In contrast thereto, a structure without the base film adhesive 101 is referred to as an adhesive less CCL. Both of the adhesive less CCL and normal CCL are general structures for use in the FPC 2. In this respect, the copper plating of the copper foil 102 is essential for through-hole plating in both-sided boards with two or more conductive layers. Further, the above-mentioned gold plating 103 can be roughly classified in view of the fact whether or not a nickel base is provided. In case a nickel base is provided, a thickness of gold can be reduced to approximately 0.03 μm compared to 0.3 μm in case no nickel base is present, therefore it is desirable in view of costs. However, an absence of the nickel base results in a generally softer structure which is preferable for bending, and it is a matter of design to determine whether or not a nickel base is to be employed.

The FPC 2 is connected to the plurality of ICs 9, 10 as shown in FIG. 16. It is thus necessary to make the FPC 2 extend outward of the gate ICs 9 as shown in FIG. 15. In case the glass substrate 11 of the liquid crystal panel 1 is laterally long, it will accordingly be necessary to extend the lateral width of the FPC 2, that is, the entire length of the panel connecting terminals 12. In this case, it will be required to reduce the cumulative dimensional tolerance of the panel connecting terminals 12 of the FPC 2.

For instance, in case the FPC 2 is of a normal CCL, the pitch of the panel connecting terminals 12 is 0.5 mm (line width/space is 0.25/0.25 mm), and the entire length of the panel connecting terminals 12 is not less than 200 mm, the cumulative dimensional tolerance will be approximately ±0.1%. Accordingly, in case the entire length of the panel connecting terminals 12 is 250 mm, the cumulative dimensional tolerance is ±0.1% of 250 mm and thus ±0.25 mm. In this case, due to the fact that the line width/space is 0.25/0.25 mm, a short circuit might, in the worst case, be caused between two adjoining panel connecting terminals 12.

In order to prevent such a short circuit, measures have been suggested to maintain the cumulative dimensional tolerance to not more than ±0.1%. As one of such measures, it has been suggested an arrangement in which pitches of the panel connecting terminals 12 are loosened, for instance, from 0.5 mm pitches to 0.8 mm pitches. However, with such an arrangement, the lateral width of the FPC 2 becomes longer so that costs will increase.

For reducing the cumulative dimensional tolerance to not more than ±0.1%, it has also been suggested to configure the FPC by an adhesive less CCL which is stronger against extension. However, the adhesive less CCL is more expensive than the normal CCL.

Figure 18:
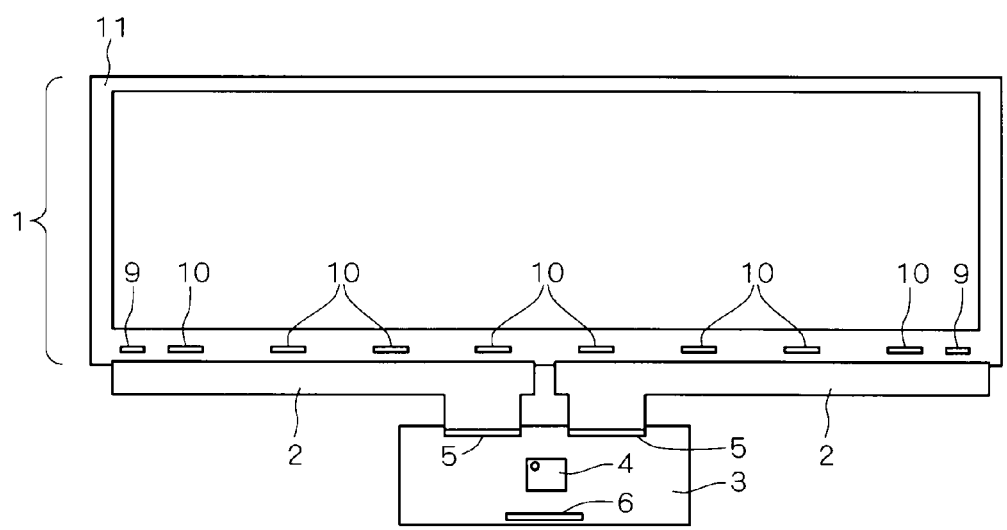
FIG. 18 is a view showing one example of a conventional IC arrangement plan including a plurality of FPCs and one example of FPCs.

It has also been suggested to provide a plurality of FPCs 2. FIG. 18 shows a liquid crystal display device including two FPCs 2. With this arrangement, it is possible to reduce the number of panel connecting terminals 12 per each FPC 2 so that the cumulative dimensional tolerance can be reduced. However, the plurality of FPCs 2 need to be surface-adhered individually so that the increased number of FPCs 2 will result in higher costs in view of control even if the total length remains the same. Also, as shown in FIG. 18, a necessity for provision of a plurality of FPC joint connectors 5 on the control board 3 side will also result in higher FPC joint connectors 5 on the control board 3 side will also result in higher costs.

In this respect, in case the plurality of ICs 9, 10 are arranged along to be closer to a center of the FPC 2 for reducing the lateral width of the FPC 2, wirings for connecting the ICs 9, 10 at end sides of the alignment with the panel connecting terminals 12 of the FPC 2 will become shorter while respective gate IC output wirings 20 and source IC output wirings 21 of the ICs 9, 10 at end sides of the alignment will contrarily become longer. Drawbacks are consequently caused in that wiring resistance values and capacitance values of the gate IC output wirings 20 and the source IC output wirings 21 will increase to negatively affect pixel drive. Therefore, a plurality of ICs are generally evenly aligned and arranged. Hereinafter, a liquid crystal display device according to the present embodiment which can reduce the lateral width of the FPC 2 also in such cases will be described.

FIG. 1 is a front view of the liquid crystal display device according to the present embodiment. As shown in FIG. 1, the liquid crystal display device according to the present embodiment includes a liquid crystal panel 1 configured by a glass substrate 11, which is an insulating substrate, and a plurality of ICs 7, 8 and 10 of COG configuration, an FPC 2, and a control board 3. Note that arrangements which are not described hereinafter are deemed to be identical to the arrangements of the above-mentioned liquid crystal display device and are assigned with identical reference numerals.

The plurality of ICs 7, 8 and 10 according to the present embodiment include gate ICs 7 and source ICs 8, 10. In the present embodiment, the plurality of ICs 7, 8 and 10 are aligned on the glass substrate 11 along a side of the glass substrate 11. Further, as shown in FIG. 1, the plurality of ICs 7, 8 and 10 are aligned and arranged in a substantially even manner. In the present embodiment, the gate ICs 7 are arranged on both end portions of the alignment of the plurality of ICs 7, 8 and 10, and the source ICs 8, 10 are arranged elsewhere. As shown in FIG. 1, respective shapes of the plurality of ICs 7, 8 and 10 of the present embodiment are rectangular. Similarly to the above-mentioned structure, from among the plurality of ICs 7, 8 and 10, the source ICs 10 are arranged such that extending directions of their longer sides are in parallel with an extending direction of the side of the glass substrate 11.

As shown in FIG. 1, the FPC 2 is arranged to extend along the side of the glass substrate 11. FIG. 2 is a view of a broken line portion of FIG. 1, that is, a vicinity of the FPC 2 on a left-hand side shown in an enlarged form. As shown in FIG. 2, the FPC 2 is connected with the plurality of ICs 7, 8 and 10. While it is not essential that the FPC 2 is disposed inward of end portions of the gate ICs 7 in the present embodiment, end portions of the FPC 2 are located inward of end portions of the alignment of the plurality of ICs 7, 8 and 10, that is, the end portions of the gate ICs 7.

Specified ICs from among the plurality of ICs 7, 8 and 10 are arranged in that extending directions of longer sides thereof are inclined with respect to the extending direction of the side of the glass substrate 11 such that those longer sides face towards a central side of the FPC 2. In the present embodiment, such specified ICs are a specified number (two in FIG. 2) of ICs from both end portions of the alignment of the plurality of ICs 7, 8 and 10, and correspond to the gate ICs 7 and the source ICs 8. In this manner, the gate ICs 7 and source ICs 8 are arranged to be inclined in a counterclockwise direction on the left end side of the alignment and in a clockwise direction on the right end side of the alignment as shown in FIGS. 1 and 2.

Figure 3:
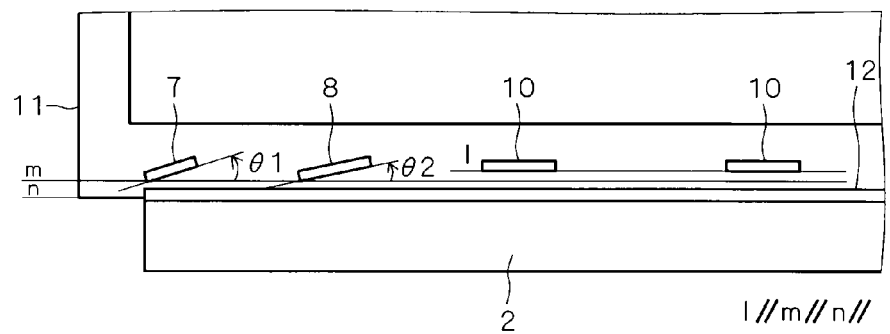
FIG. 3 is an auxiliary view of FIG. 2.

FIG. 3 is a view showing inclined conditions of the gate IC 7 and the source IC 8 on the left end side of the alignment. In FIG. 3, wirings are not shown for the purpose of simplification. In this figure, lines 1, m and n are respectively parallel to each other. Angles formed by extending directions of respective long sides of the gate IC 7 and the source IC 8 with respect to the extending direction (line m) of the side of the glass substrate 11 (line n) are defined to be $\theta 1$, $\theta 2$. As shown in FIG. 3, the gate IC 7 and the source IC 8 of the present embodiment are arranged such that $\theta 1 > \theta 2$ is satisfied. In this manner, according to the present embodiment, the gate ICs 7 and the source ICs 8 are arranged at larger inclinations in approaching outsides of the FPC 2. Further, according to the present embodiment, inclination angles $\theta$ of the gate ICs 7 and the source ICs 8 ($\theta = \theta 1$ or $\theta 2$) satisfy the relationship of $0° < \theta < 45°$.

Figure 4:
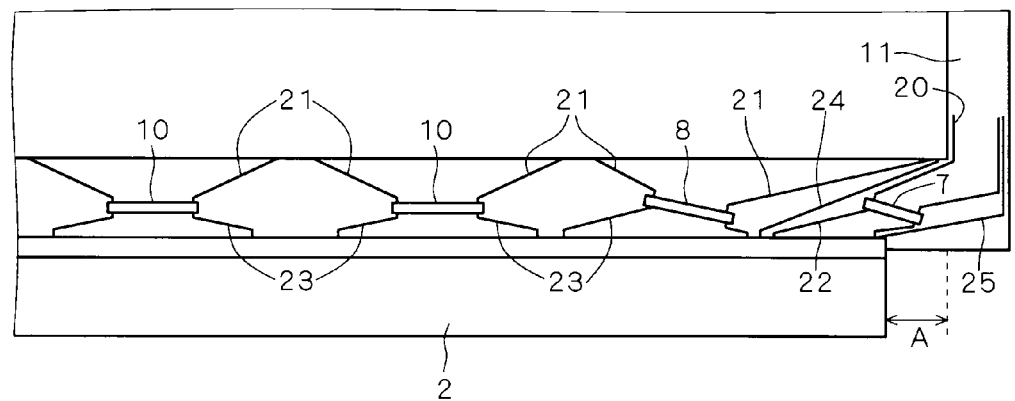
FIG. 4 is an enlarged view of a right end portion of FIG. 1.

While the left-hand side of the alignment of the plurality of ICs 7, 8 and 10 has been described above, the same arrangements are also made on the right-hand side of the alignment of the plurality of ICs 7, 8 and 10 in the present embodiment as shown in FIG. 4. In this manner, the gate IC 7 and the source IC 8 on the right-hand side of the alignment of a plurality of ICs 7, 8 and 10 are arranged to be inclined in a clockwise direction.

Figure 5:
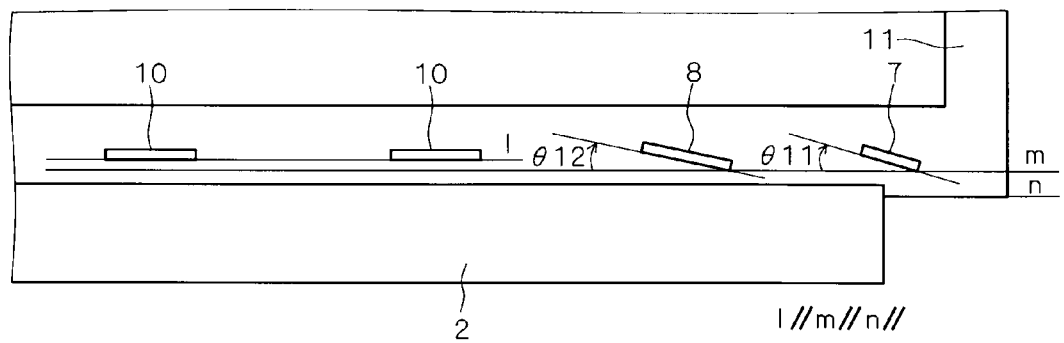
FIG. 5 is an auxiliary view of FIG. 4.

FIG. 5 is a view showing inclined conditions of the gate IC 7 and the source IC 8 on the right-hand side of the alignment. Here, angles formed by the extending directions of the respective long sides of the gate IC 7 and the source IC 8 with respect to the extending direction (line m) of the side of the glass substrate 11 (line n) are defined to be $\theta 11$, $\theta 12$. As shown in FIG. 5, the gate IC 7 and the source IC 8 on the right-hand side are arranged in the present embodiment such that $\theta 1 = \theta 11$, $\theta 2 = \theta 12$ are satisfied. In this manner, according to the present embodiment, the gate ICs 7 and the source ICs 8 are arranged to be symmetrically inclined with respect to a central axis of the FPC 2.

According to such a liquid crystal display device of the present embodiment, the gate ICs 8 and the source ICs 8 are aligned in the above-described inclined manner so that wiring regions from the ICs 7, 8 towards the FPC 2 side can be shifted towards the central side of the FPC 2. The broken line drawn on the left-hand side of the FPC 2 in FIG. 2 indicates a lateral width of the FPC 2 of the conventional liquid crystal display device as shown in FIG. 16. Therefore, also in a case where positions of the plurality of ICs 7, 8 and 10 are restricted so that they cannot be largely changed, the lateral width of the FPC 2 can be shortened by distance A by shifting wiring regions towards the central side of the FPC 2. As a result, regions of dummy terminals can be reduced to cause reduction in the length of the FPC 2 and thus reduce costs of the FPC 2, and it is further possible to reduce the cumulative dimensional tolerance. Occasions in which the plurality of FPCs 2 do not need to be provided will also increase so that the plurality of FPC joint connectors 5 do not need to be provided. Costs can accordingly be reduced.

Figure 6A:
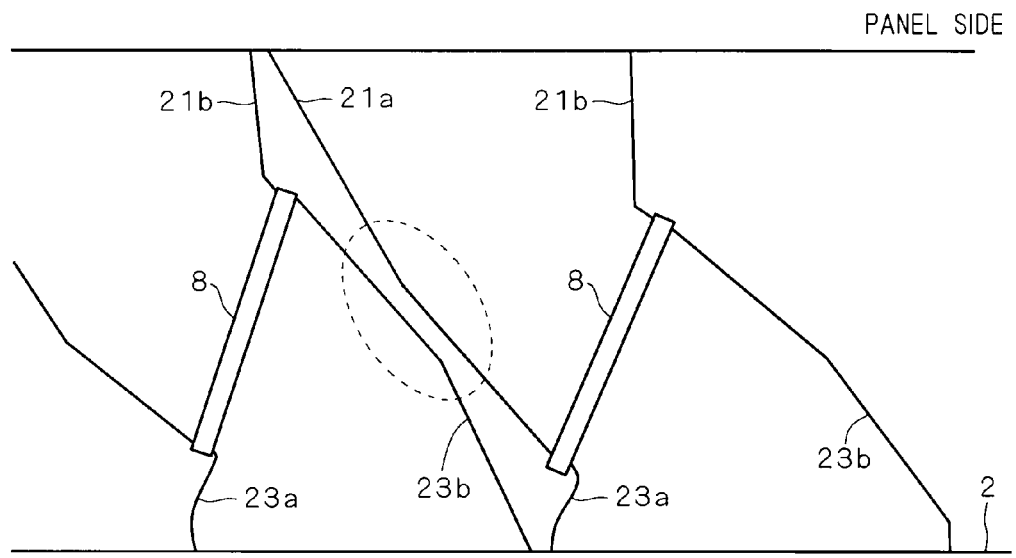
FIGS. 6A and 6B are views showing effects achieved by an IC arrangement of the liquid crystal display device according to the first embodiment.
Figure 6B:
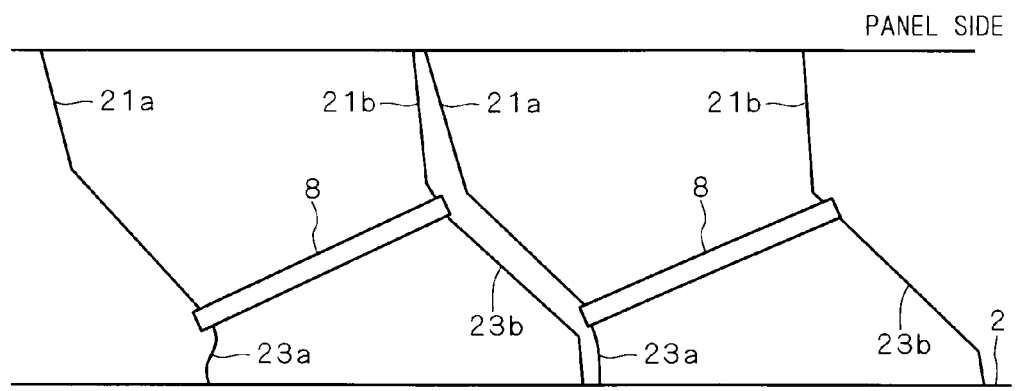

According to the present embodiment, angles $\theta$ of the gate ICs 7 and source ICs 8 ($\theta = \theta 1$ or $\theta 2$) have been defined to satisfy the relationship of $0° < \theta < 45°$. This effect will now be described with reference to FIGS. 6A and 6B. For simply describing the effects of the inclination angles, these figures show an example where two source ICs 8 are inclined. When the inclination angle is defined to be $45° \leq \theta < 90°$ (FIG. 6A), at the left end portion of the source IC 8, the source IC input wiring 23a will become shorter while the source IC output wiring 21a becomes contrarily longer. On the other hand, at the right end portion of the source IC 8, the source IC output wiring 21b will become shorter while the source IC input wiring 23b becomes contrarily longer. Since the source IC input wiring 23b at the right end portion will approach the source IC output wiring 21a at the left end portion between adjoining source ICs 8 (see broken line portion of the drawing), it is by any means necessary to secure a wiring region with which a safe inter-wiring distance is maintained so that the input/output wirings will consequently become long. In contrast thereto, when the inclination angle $\theta$ is defined to be $0° < \theta < 45°$ (FIG. 6B), it will be easier to secure regions for the input and output wirings of the gate ICs 7 and source ICs 8 and to reduce wiring distances of the glass substrate 11 as compared to a case where the inclination angle $\theta$ is defined to be $45° \leq \theta < 90°$. In this manner, by reducing the wiring distances on the glass substrate 11, it is possible to reduce a frame portion width between an effective area and a contour size of the panel in the liquid crystal panel 1. It should be noted that although line l and line m are different lines in the present embodiment, the invention is not limited thereto, and the lines may also be identical lines.

Particularly, since multi-output ICs having 600 to 800 outputs as used in these years have large longer sides and small shorter sides, it is possible to achieve satisfactory effects even with small inclination angles. Moreover, while the plurality of ICs 7, 8 and 10 are mounted onto the liquid crystal panel 1 through pressure bonding using tools, small rotating angles are advantageous in case the tools are of narrow width and are particularly effective in case of multi-output ICs.

The plurality of ICs 7, 8 and 10 have been evenly aligned and arranged in the present embodiment, the present invention is not limited thereto. Further, the present embodiment has been arranged in that the specified ICs are two ICs (gate ICs 7 and source ICs 8) from the end portions of the alignment of the plurality of ICs 7, 8 and 10. However, the present invention is not limited thereto, and the specified ICs may also be only the gate ICs 7 at the ends of the alignment or all of the plurality of ICs 7, 8 and 10. In this case, it will depend on the total number of ICs and locations of the ICs whether to choose the left-hand side or the right-hand side of the FPC 2, and it shall be determined in accordance therewith whether the ICs are to be inclined in a counterclockwise direction or in a clockwise direction.

Figure 7:
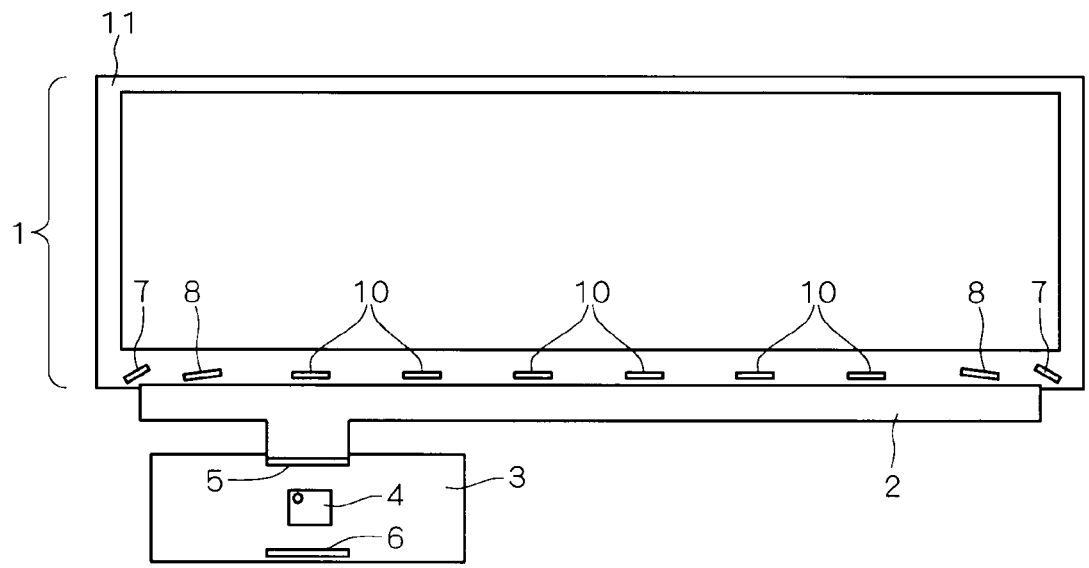
FIGS. 7 to 9 are views showing one example of a liquid crystal display device according to the first embodiment.
Figure 8:
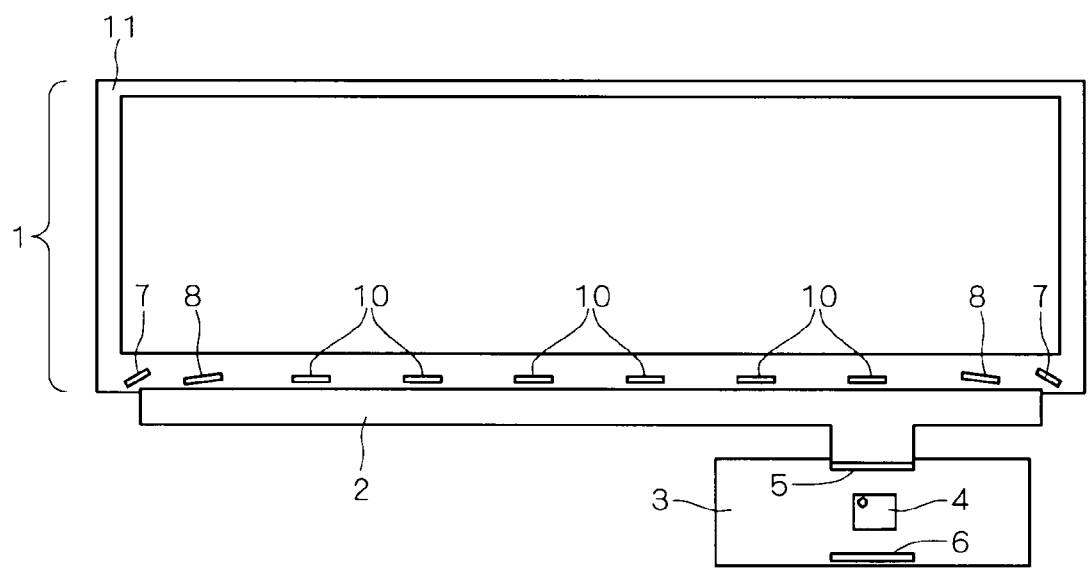

Further, according to the present embodiment, it has been described that the shape of the FPC 2 is of T-shaped form and that the control board 3 is disposed at the central portion of the liquid crystal panel 1. However, the present invention is not limited thereto, and it is alternatively possible that the FPC 2 has an L-shaped form and that the control board 3 is disposed on the left-hand side or on the right-hand side of the liquid crystal panel 1 as shown in FIGS. 7 and 8. The above-mentioned effects can also be achieved in such cases. In this respect, whether to employ a T-shaped form or an L-shaped form as the shape of the FPC 2 may be determined in accordance with a position of the system side joint connecter 6.

Second Embodiment

Figure 9:
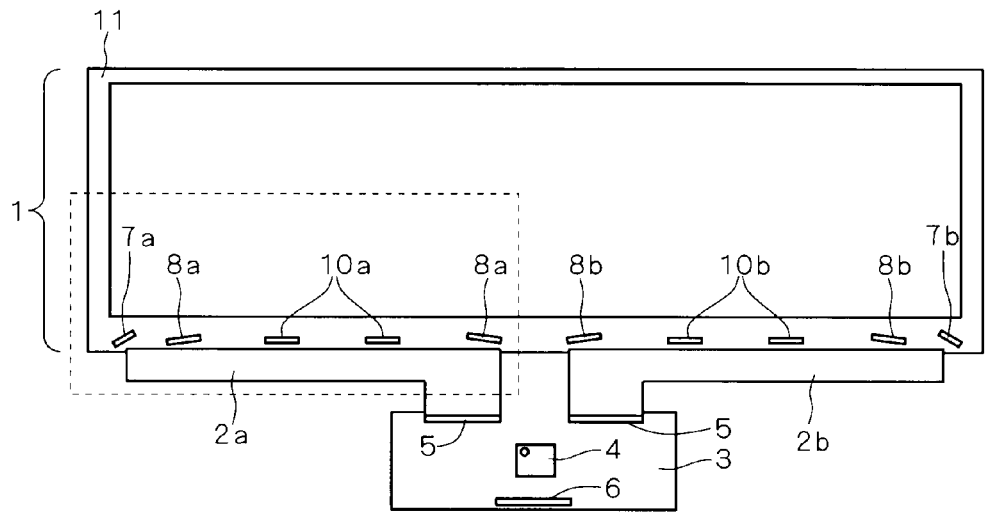

FIG. 9 is a front view of a liquid crystal display device according to the present embodiment. The FPC 2 according to the present embodiment includes a plurality of FPCs 2a, 2b. As shown in FIG. 9, an FPC 2a is illustrated on the left-hand side of FIG. 9 while an FPC 2b is illustrated on the right-hand side of FIG. 9. Hereinafter, arrangements of the liquid crystal display device according to the present embodiment that are identical to those of the first embodiment will be marked with corresponding reference numerals, and arrangements which are not newly described are deemed to be identical to those of the first embodiment.

Figure 10:
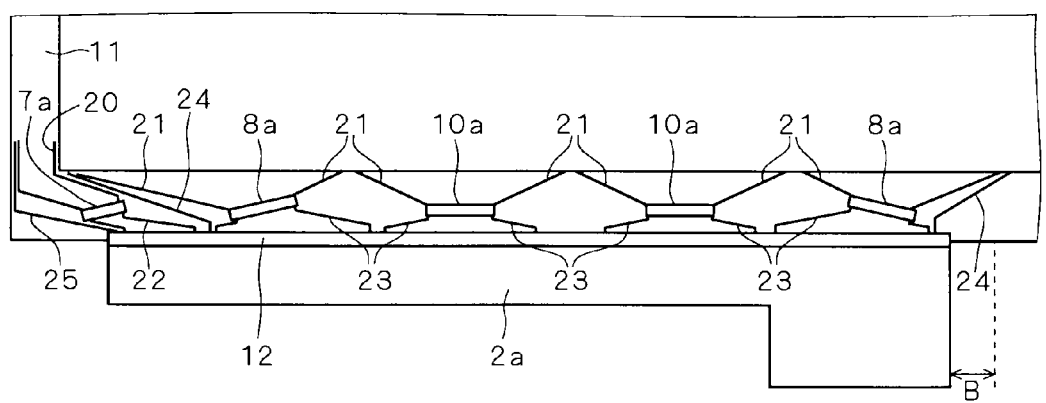
FIG. 10 is an enlarged view of a broken line portion of FIG. 9.

FIG. 10 is a view of a broken line portion of FIG. 9, that is, the FPC 2a illustrated on the left-hand side in FIG. 9 in an enlarged form. In the present embodiment, in each corresponding FPC 2a, 2b, specified ICs are respectively arranged to face towards central sides of the FPC 2a, 2b. In FIG. 10, a gate IC 7a and a source IC 8a, which constitute specific ICs, are arranged such that their longer sides face towards the central side of the FPC 2a.

Although not shown in the enlarged form, a gate IC 7b and a source IC 8b, which constitute the specific ICs, are also arranged such that their longer sides face towards the central side of the FPC 2b as illustrated in FIG. 9. As also shown in FIG. 9, the gate IC 7a and the gate IC 7b are arranged to be inclined to be bilaterally symmetric in the present embodiment. Further, according to the present embodiment, the source ICs 8a are arranged to be inclined in a bilaterally symmetric manner with respect to each other and the source ICs 8b are arranged to be inclined in a bilaterally symmetric manner with respect to each other.

Figure 11:
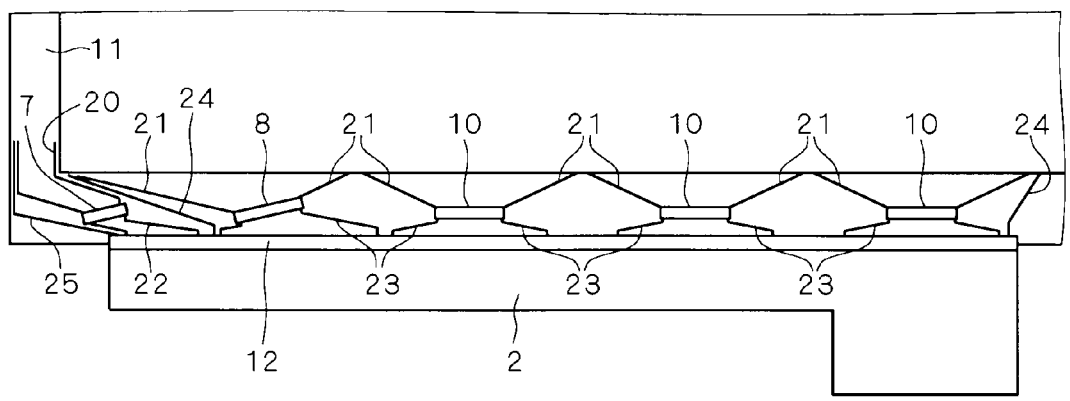
FIG. 11 is a view showing an IC arrangement substantially similar to a conventional one only on a right end portion of an FPC on the left-hand side in FIG. 9.

According to such a liquid crystal display device of the present embodiment, the source ICs 8a proximate to the right-hand side of the FPC 2a are aligned to be inclined in a clockwise direction so that a wiring region from these source ICs 8a to the FPC 2a side can be shifted towards the central side of the FPC 2a. FIG. 11 is a view corresponding to FIG. 10 wherein only two ICs (gate IC 7 and source IC 8) from the left end portion of the alignment of the plurality of ICs 7, 8 and 10 are inclined. The broken line drawn on the right-hand side of the FPC 2a in FIG. 10 indicates a lateral width of the FPC 2 of the liquid crystal display device shown in FIG. 11. In this manner, also in the case where the positions of the plurality of ICs 7, 8 and 10 are restricted so that they cannot be largely changed, the lateral width of the FPC 2a can be shortened by distance B by shifting wiring regions towards the central side of the FPC 2a. Further, though not illustrated, the lateral width of the FPC 2b on the right-hand side in FIG. 9 can similarly be shortened. As a result, regions of dummy terminals can be reduced to cause reductions in costs of the FPCs 2a and 2b and thus to reduce the cumulative dimensional tolerance.

Third Embodiment

Figure 12:
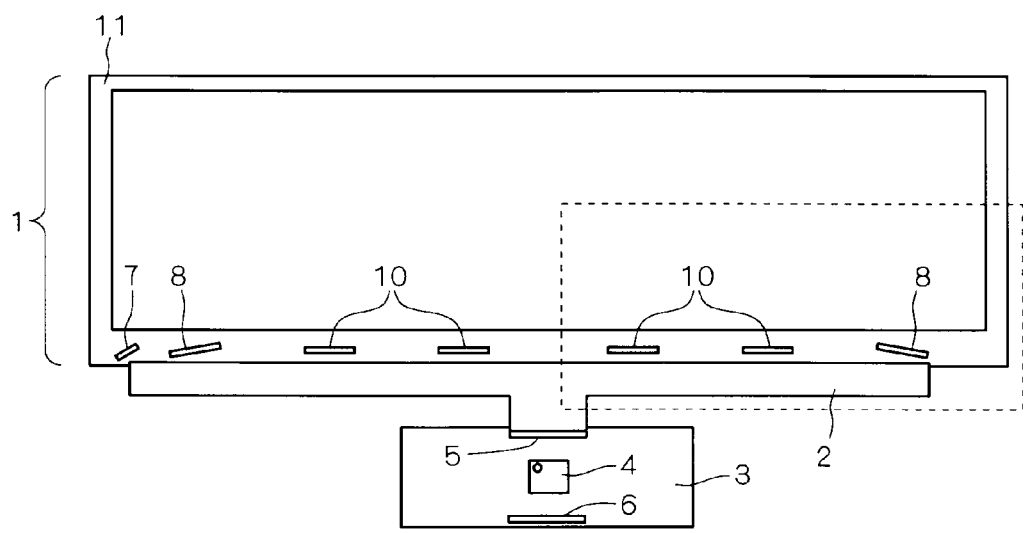
FIG. 12 is a view showing one example of a liquid crystal display device according to a third embodiment.

FIG. 12 is a front view of a liquid crystal display device according to the present invention. In the first and second embodiments, the gate ICs 7 are disposed on both end portions of the alignment of the plurality of ICs 7, 8 and 10. According to the present invention, the gate IC 7 is arranged on one end portion of the alignment of the plurality of ICs 7, 8 and 10, for instance, only on the left end portion of the alignment. In this respect, the left end portion of the alignment of the plurality of ICs 7, 8 and 10 is of identical arrangement as that of the first embodiment.

FIG. 13 is a view of a broken line portion of FIG. 12, that is, a right-hand side of the FPC 2 shown in an enlarged form. According to the present embodiment, specified ICs from among the plurality of ICs 7, 8 and 10 are identical to those of the first embodiment in a point that they are arranged in that extending directions of longer sides thereof are inclined with respect to an extending direction of the side of the glass substrate 11 to face towards a central side of the FPC 2. While the numbers of inclined ICs differ on the right and left in the present invention in contrast to the first embodiment since the gate IC 7 is arranged on one side only, inclinations of the gate IC 7 and source ICs 8 on the right and left are defined to be symmetric. In other words, it means that an inclination angle θ1 of the left end gate IC 7 is identical to an inclination angle θ12 of the right end source IC 8 or that an inclination angle θ2 of the left source IC 8 is identical to an inclination angle θ12 of the right source IC.

According to such a liquid crystal display device according to the present embodiment, the source IC 8 proximate to the right-hand side of the FPC 2 is aligned to be inclined in a clockwise direction so that a wiring region from the source IC 8 towards the FPC 2 side can be shifted towards a central side of the FPC 2. FIG. 14 is a view corresponding to FIG. 13 and is a view in which the ICs (source ICs 10) on the right-hand side of the alignment of the plurality of ICs 7, 8 and 10 are not inclined. A broken line drawn on the right-hand side of the FPC 2 in FIG. 13 indicates a lateral width of the FPC 2 of the liquid crystal display device shown in FIG. 14. As shown in FIG. 13, also in the case where the positions of the plurality of ICs 7, 8 and 10 are restricted so that they cannot be largely changed, it is accordingly possible to shorten the lateral width of the FPC 2 by distance C by shifting wiring regions towards the central side of the FPC 2. It is accordingly possible to reduce regions of dummy terminals to reduce costs of the FPC 2 and also to reduce the cumulative dimensional tolerance.

The present embodiment has been described with respect to a case where the gate IC 7 is arranged only on the left end portion of the alignment of the plurality of ICs 7, 8 and 10. However, the present invention is not limited thereto, and the gate IC 7 may be arranged only on the right end portion of the alignment of the plurality of ICs 7, 8 and 10. In such a case, same effects as those of the present embodiment can be achieved by employing an arrangement that will be symmetric to the arrangement described in the present embodiment with respect to a central axis of the FPC 2.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display device, comprising:
    an insulating substrate;
    a plurality of integrated circuits Chip On Glass aligned on said insulating substrate along a side of said insulating substrate; and
    a Flexible Printed Circuit arranged to extend along said side of said insulating substrate and connected with said plurality of integrated circuits, wherein at least some of said integrated circuits from among said plurality of integrated circuits are arranged such that extending directions of longer sides thereof are inclined with respect to an extending direction of said side of said insulating substrate, such that those longer sides face towards a central side of said Flexible Printed Circuit,
    wherein said at least some of said integrated circuits include a specified number of integrated circuits from end portions of an alignment of said plurality of integrated circuits.

2. The liquid crystal display device according to claim 1, wherein said at least some of said integrated circuits are arranged at larger inclinations in approaching outsides of said Flexible Printed Circuit.

3. A liquid crystal display device, comprising:
    an insulating substrate;
    a plurality of integrated circuits Chip On Glass aligned on said insulating substrate along a side of said insulating substrate; and
    a Flexible Printed Circuit arranged to extend along said side of said insulating substrate and connected with said plurality of integrated circuits, wherein at least some of said integrated circuits from among said plurality of integrated circuits are arranged such that extending directions of longer sides thereof are inclined with respect to an extending direction of said side of said insulating substrate, such that those longer sides face towards a central side of said Flexible Printed Circuit,
    wherein said at least some of said integrated circuits are arranged to be symmetrically inclined with respect to a central axis of said Flexible Printed Circuit.

4. The liquid crystal display device according to claim 1, wherein inclination angles $\theta$ of said at least some of said integrated circuits satisfy the relationship of $0°<\theta<45°$.

5. The liquid crystal display device according to claim 1, wherein end portions of said Flexible Printed Circuit are positioned inward of end portions of the alignment of said plurality of integrated circuits.

6. The liquid crystal display device according to claim 1, wherein said Flexible Printed Circuit includes a plurality of Flexible Printed Circuits, and wherein in each corresponding Flexible Printed Circuit, said at least some of said integrated circuits are respectively arranged to face towards central sides of the Flexible Printed Circuit.

7. The liquid crystal display device according to claim 3, wherein said at least some of said integrated circuits are arranged at larger inclinations in approaching outsides of said Flexible Printed Circuit.

8. The liquid crystal display device according to claim 3, wherein inclination angles $\theta$ of said at least some of said integrated circuits satisfy the relationship of $0°<\theta<45°$.

9. The liquid crystal display device according to claim 3, wherein end portions of said Flexible Printed Circuit are positioned inward of end portions of the alignment of said plurality of integrated circuits.

10. The liquid crystal display device according to claim 3, wherein said Flexible Printed Circuit includes a plurality of Flexible Printed Circuits, and wherein in each corresponding Flexible Printed Circuit, said at least some of said integrated circuits are respectively arranged to face towards central sides of the Flexible Printed Circuit.

* * * * *